(12) United States Patent
King et al.

(10) Patent No.: US 9,973,156 B2
(45) Date of Patent: May 15, 2018

(54) GENERATION OF VOLTAGE REFERENCE SIGNALS IN A HYBRID SWITCHED MODE AMPLIFIER

(71) Applicant: Cirrus Logic International Semiconductor Ltd., Edinburgh (GB)

(72) Inventors: Eric J. King, Dripping Springs, TX (US); Zhaohui He, Austin, TX (US); John L. Melanson, Austin, TX (US); Siddharth Maru, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/285,038

(22) Filed: Oct. 4, 2016

(65) Prior Publication Data

US 2017/0272043 A1    Sep. 21, 2017

Related U.S. Application Data

(60) Provisional application No. 62/309,068, filed on Mar. 16, 2016.

(51) Int. Cl.
*H03F 3/217*    (2006.01)
*H03F 1/02*    (2006.01)
(Continued)

(52) U.S. Cl.
CPC ......... *H03F 3/2171* (2013.01); *H03F 1/0216* (2013.01); *H03F 3/185* (2013.01);
(Continued)

(58) Field of Classification Search
USPC ............................ 330/10, 251, 207 A, 136
See application file for complete search history.

(56) References Cited

U.S. PATENT DOCUMENTS 3,851,269 A    11/1974    Szorc
6,348,781 B1    2/2002    Midya et al.
(Continued)

FOREIGN PATENT DOCUMENTS

EP    1367704 A2    12/2003
GB    2510395 A    8/2014
(Continued)

OTHER PUBLICATIONS

International Search Report and Written Opinion of the International Searching Authority, International Patent Application No. PCT/US2016/040072, dated Sep. 16, 2016.
(Continued)

*Primary Examiner* — Hieu Nguyen
(74) *Attorney, Agent, or Firm* — Jackson Walker L.L.P.

(57) ABSTRACT

A method may include processing a first signal derived from an input signal with a first path to generate a first path voltage at a first path output, processing a second signal derived from the input signal with a second path to generate a second path voltage at a second path output, the second path comprising a linear amplifier having at least one transistor for driving the second path voltage, generating the first signal and the second signal with a signal splitter, such that the second signal comprises information of the input signal absent from the first signal, and such that the second path voltage is of a sufficient magnitude such that the at least one transistor operates in a saturation region of the at least one transistor throughout a dynamic range of a load voltage equal to the difference of the first path voltage and the second path voltage.

18 Claims, 7 Drawing Sheets

(51) Int. Cl.
*H04R 3/12* (2006.01)
*H03F 3/185* (2006.01)

(52) U.S. Cl.
CPC .......... *H04R 3/12* (2013.01); *H03F 2200/03* (2013.01); *H03F 2200/153* (2013.01)

(56) References Cited

U.S. PATENT DOCUMENTS

| | | | |
|---|---|---|---|
| 6,617,908 | B1 | 9/2003 | Thomsen et al. |
| 6,727,752 | B2 * | 4/2004 | Skinner ................ H03F 3/2173 330/207 A |
| 7,084,799 | B1 | 8/2006 | Butler |
| 7,265,524 | B2 | 9/2007 | Jordan et al. |
| 7,466,194 | B2 | 12/2008 | Mazda et al. |
| 8,242,847 | B1 | 8/2012 | Leong et al. |
| 8,638,168 | B1 | 1/2014 | Signoff et al. |
| 8,773,196 | B2 | 7/2014 | Delano |
| 9,088,211 | B2 | 7/2015 | Ivanov et al. |
| 9,628,033 | B2 | 4/2017 | King et al. |
| 9,647,611 | B1 * | 5/2017 | Embar ................ H03F 1/0288 |
| 2003/0122615 | A1 | 7/2003 | Zeff |
| 2003/0222713 | A1 | 12/2003 | Skinner et al. |
| 2004/0169552 | A1 | 9/2004 | Butler |
| 2005/0083115 | A1 | 4/2005 | Risbo |
| 2007/0229332 | A1 | 10/2007 | Tsividis |
| 2008/0111622 | A1 | 5/2008 | Sperlich et al. |
| 2008/0310046 | A1 | 12/2008 | Menegoli et al. |
| 2009/0027247 | A1 | 1/2009 | Kumamoto et al. |
| 2009/0212859 | A1 | 8/2009 | Lesso et al. |
| 2010/0214024 | A1 | 8/2010 | Jones et al. |
| 2010/0237941 | A1 | 9/2010 | Goldfarb et al. |
| 2012/0306575 | A1 | 12/2012 | Shah et al. |
| 2014/0028395 | A1 | 1/2014 | Chan et al. |
| 2015/0071464 | A1 | 3/2015 | Du et al. |
| 2015/0222184 | A1 | 8/2015 | Melanson et al. |
| 2015/0323947 | A1 | 11/2015 | Amadi et al. |
| 2016/0056707 | A1 | 2/2016 | Wong et al. |
| 2017/0207755 | A1 | 7/2017 | He et al. |
| 2017/0207759 | A1 | 7/2017 | He et al. |
| 2017/0271996 | A1 | 9/2017 | King et al. |
| 2017/0272043 | A1 | 9/2017 | King et al. |
| 2017/0272044 | A1 | 9/2017 | Melanson et al. |

FOREIGN PATENT DOCUMENTS

| | | |
|---|---|---|
| GB | 2546576 A | 7/2017 |
| GB | 2548443 A | 9/2017 |
| JP | S59224905 A | 12/1984 |
| WO | 98/57422 A1 | 12/1998 |
| WO | 2007136800 A2 | 11/2007 |
| WO | 2017127132 A1 | 7/2017 |
| WO | 2017127353 A1 | 7/2017 |
| WO | 2017160520 A1 | 9/2017 |
| WO | 2017160522 A1 | 9/2017 |
| WO | 2017160556 A1 | 9/2017 |

OTHER PUBLICATIONS

Combined Search Report and Written Opinion, GB Application No. 1617096.1, dated Apr. 7, 2017.
Search Report, GB Application No. 1619679.2, dated Apr. 28, 2017.
International Search Report and Written Opinion of the International Searching Authority, International Patent Application No. PCT/US2017/020927, dated May 26, 2017.
International Search Report and Written Opinion of the International Searching Authority, International Patent Application No. PCT/US2017/021351, dated May 26, 2017.
International Search Report and Written Opinion of the International Searching Authority, International Patent Application No. PCT/US2017/013756, dated May 30, 2017.
Eynde, Frank O. On the relationship between the CMRR or PSRR and the second harmonic distortion of differential input amplifiers, IEEE Journal of Solid-State Circuits, vol. 24, Issue: 6, Dec. 1989, pp. 1740-1744.
Combined Search and Examination Report under Sections 17 and 18(3) of the UKIPO, Application No. GB1701269.1, dated Jul. 7, 2017.
Combined Search and Examination Report under Sections 17 and 18(3) of the UKIPO, Application No. GB1703492.7, dated Aug. 31, 2017.
Combined Search and Examination Report under Sections 17 and 18(3) of the UKIPO, Application No. GB1703865.4, dated Aug. 31, 2017.
International Search Report and Written Opinion of the International Searching Authority, International Application No. PCT/US2017/020911, dated Nov. 7, 2017.

* cited by examiner

GENERATION OF VOLTAGE REFERENCE SIGNALS IN A HYBRID SWITCHED MODE AMPLIFIER

FIELD OF DISCLOSURE

The present disclosure relates in general to circuits for audio devices, including without limitation personal audio devices such as wireless telephones and media players, and more specifically, to a switched mode amplifier including a switched mode converter for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a signal processing system for producing a load voltage at a load output of the signal processing system, the load output comprising a first load terminal having a first load voltage and a second load terminal having a second load voltage such that the load voltage comprises a difference between the first load voltage and the second load voltage, may be provided. The system may include a first processing path configured to process a first signal derived from an input signal to generate a first path voltage at a first processing path output, a second processing path configured to process a second signal derived from the input signal to generate a second path voltage at a second processing path output, the second processing path comprising a linear amplifier having at least one transistor for driving the second path voltage, a signal splitter configured to receive the input signal and generate the first signal and the second signal from the input signal, such that the second signal comprises information of the input signal absent from the first signal, and such that the second path voltage is of a sufficient magnitude such that the at least one transistor operates in a saturation region of the at least one transistor throughout a dynamic range of the load voltage, and a controller configured to control the first processing path, the second processing path, and the splitter in order to generate the load voltage as a function of the input signal.

In accordance with these and other embodiments of the present disclosure, a method for producing a load voltage at a load output of the signal processing system, the load output comprising a first load terminal having a first load voltage and a second load terminal having a second load voltage such that the load voltage comprises a difference between the first load voltage and the second load voltage, may be provided. The method may include processing a first signal derived from an input signal with a first processing path to generate a first path voltage at a first processing path output, processing a second signal derived from the input signal with a second processing path to generate a second path voltage at a second processing path output, the second processing path comprising a linear amplifier having at least one transistor for driving the second path voltage, generating the first signal and the second signal with a signal splitter, such that the second signal comprises information of the input signal absent from the first signal, and such that the second path voltage is of a sufficient magnitude such that the at least one transistor operates in a saturation region of the at least one transistor throughout a dynamic range of the load voltage, and controlling the first processing path, the second processing path, and the splitter in order to generate the load voltage as a function of the input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
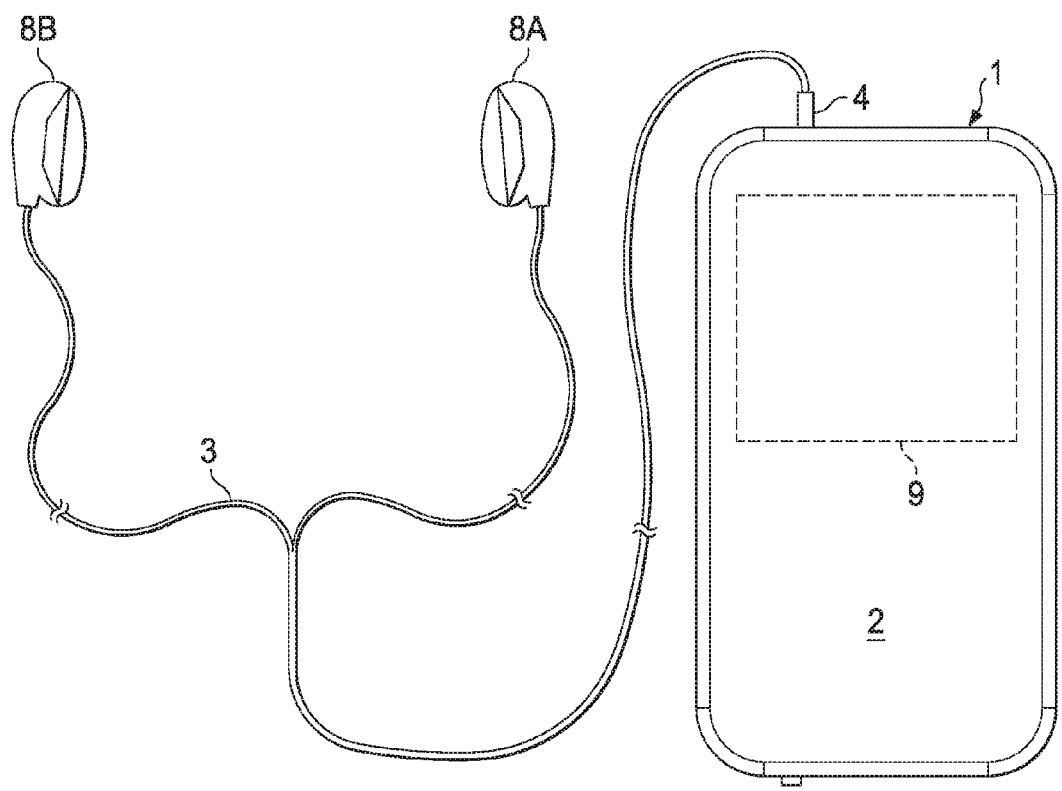
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
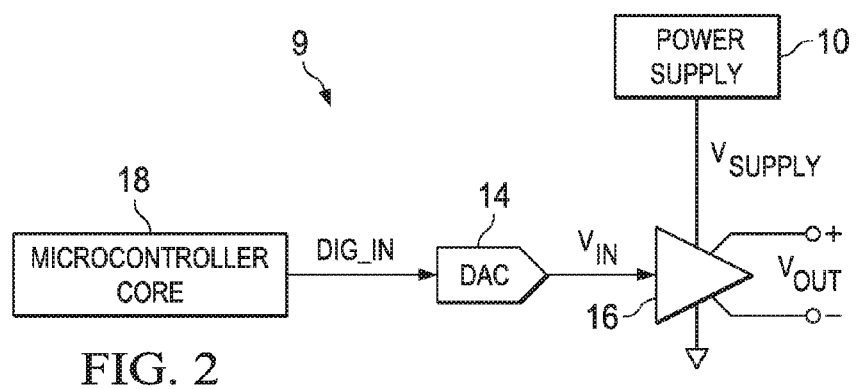
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
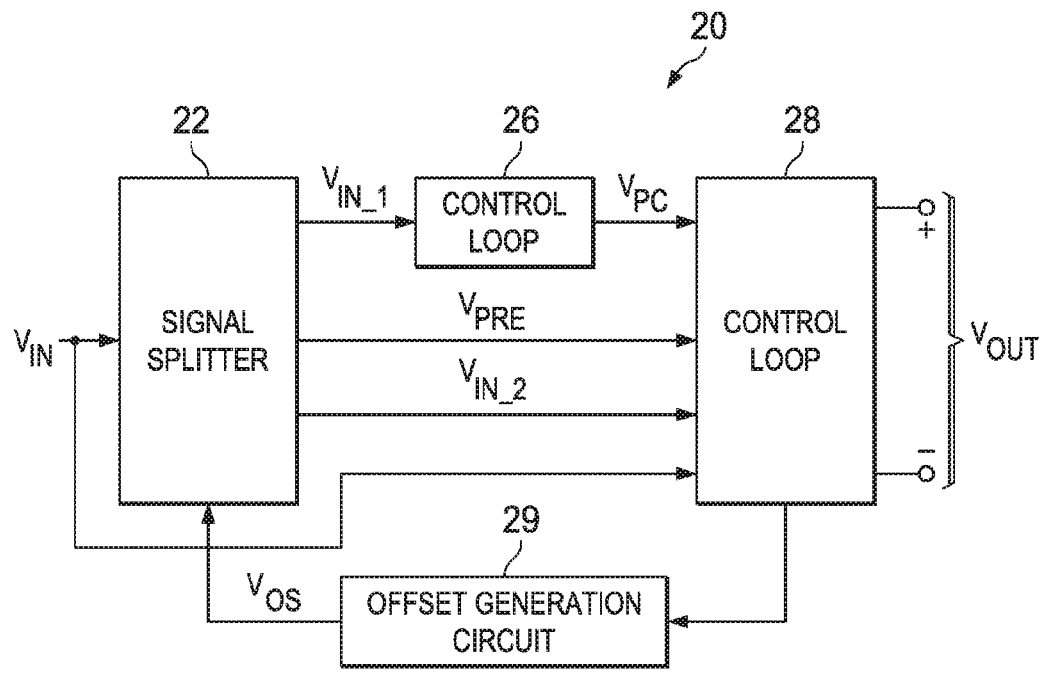
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a signal splitter 22, a first control loop 26, a second control loop 28, and an offset generation circuit 29.

Signal splitter 22 may comprise any system, device, or apparatus configured to receive audio input signal $V_{IN}$ (or a derivative thereof) and a voltage offset signal $V_{OS}$, and based thereon generate a first signal $V_{IN\_1}$ derived from audio input signal $V_{IN}$ and generate a second signal $V_{IN\_2}$ derived from audio input signal $V_{IN}$, wherein second signal $V_{IN\_2}$ comprises information of the input signal absent from first signal $V_{IN\_1}$ (e.g., $V_{IN\_2}=V_{IN}-V_{IN\_1}$). The voltage offset signal $V_{OS}$ may represent to leave sufficient headroom for a linear amplifier (e.g., linear amplifier 60, described below) of second control loop 28 to operate in a desirable manner.

For example, one or more transistors (e.g., metal-oxide-semiconductor field-effect transistor) in an output stage of the linear amplifier may require a certain voltage headroom (e.g., 100 mV) to maintain operation in its saturation region or near saturation in order to ensure a stable gain for the linear amplifier. Thus, by adding such voltage offset signal $V_{OS}$, the output of such linear amplifier (e.g., voltage $V_{AMP}$ described below) may be of a sufficient magnitude such that the afore-mentioned one or more transistors (e.g., one or more of transistors 80, 80A, 80B, 82, 82A, and 82B described in greater detail below) operate in a saturation region of the one or more transistors throughout a dynamic range of the audio output signal $V_{OUT}$.

Accordingly, in some embodiments, first signal $V_{IN\_1}$ and second signal $V_{IN\_2}$ may be governed by the following set of equations:

$$V_{IN\_1}=V_{IN}+V_{OS}; \text{ for } |V_{IN}|>V_{SAT\_IN}$$

$$V_{IN\_1}=V_{SAT\_IN}+V_{OS}; \text{ for } |V_{IN}|\leq V_{SAT\_IN}$$

$$V_{IN\_2}=V_{OS}; \text{ for } |V_{IN}|>V_{SAT\_IN}$$

$$V_{IN\_2}=V_{SAT\_IN}-V_{IN}+V_{OS}; \text{ for } |V_{IN}|\leq V_{SAT\_IN}$$

where $V_{SAT\_IN}$ represents a lower saturation voltage of audio input signal $V_{IN}$ which may be related to a lower saturation voltage of a power converter implemented by first control loop 26, as described in greater detail below. In addition, because each of first signal $V_{IN\_1}$ and second signal $V_{IN\_2}$, include a term for the voltage offset signal $V_{OS}$, such voltage offset signal $V_{OS}$ may be effectively cancelled in audio output signal $V_{OUT}$.

Offset generation circuit 29 may comprise any suitable system, device, or apparatus for generating voltage offset signal $V_{OS}$. For example, in some embodiments, offset generation circuit 29 may comprise any system that generates a fixed voltage offset signal $V_{OS}$ predetermined by testing or characterization of switched mode amplifier 20 by a designer of switched mode amplifier 20. As another example, in some embodiments, offset generation circuit 29 may comprise a monitoring circuit configured to determine the minimum magnitude of a direct current voltage offset to be included within second signal $V_{IN\_2}$ to provide for transistor operation in the saturation region, as described above, and communicate a signal indicative of the minimum magnitude (e.g., voltage offset signal $V_{OS}$) to signal splitter 22. As a further example, in some embodiments, offset generation circuit 29 may comprise a learning circuit employing a voltage feedback loop configured to learn the minimum magnitude of a direct current voltage offset to be included within second signal $V_{IN\_2}$, to provide for transistor operation in the saturation region, as described above, and communicate a signal indicative of the minimum magnitude (e.g., voltage offset signal $V_{OS}$) to signal splitter 22.

In addition to the foregoing, signal splitter 22 may also generate a precompensation voltage signal $V_{PRE}$, which may be communicated to control loop 28. The value of precompensation voltage signal $V_{PRE}$ is discussed in greater detail below with respect to FIG. 5.

Figure 4:
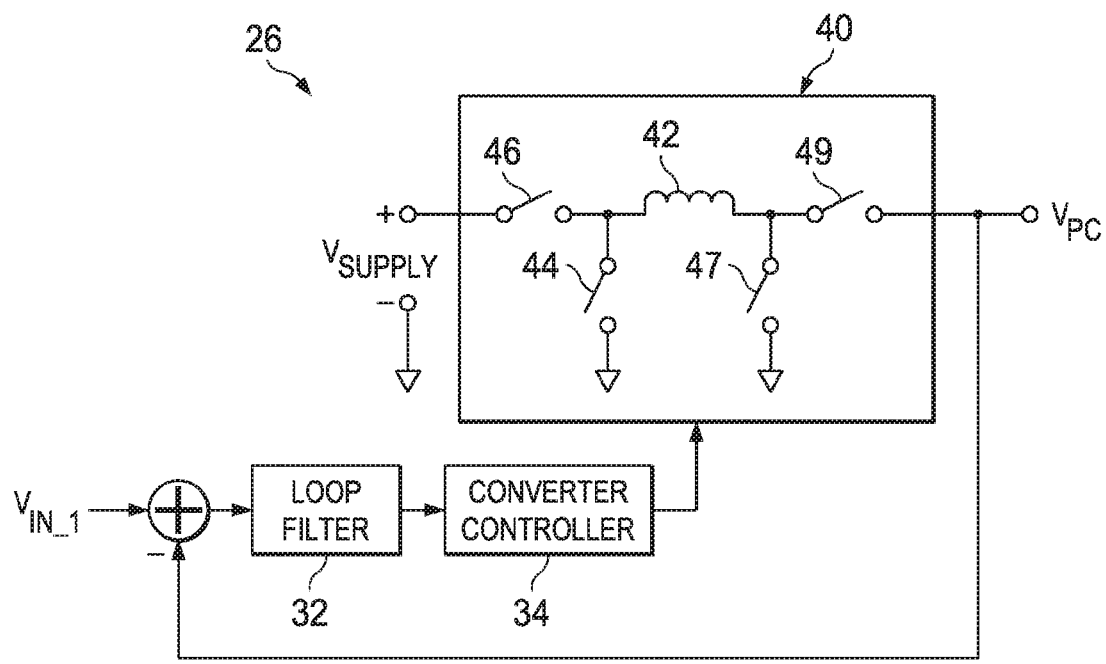
FIG. 4 illustrates a circuit diagram of selected components of an example control loop that may be used to implement the first control loop depicted in FIG. 3, in accordance with embodiments of the present disclosure.

First control loop 26 may receive first signal $V_{IN\_1}$ at its input and may generate at its output a voltage $V_{PC}$ as a function of first signal $V_{IN\_1}$. Turning briefly to FIG. 4, FIG. 4 illustrates a circuit diagram of selected components of an example control loop 26 that may be used to implement first control loop 26 depicted in FIG. 3, in accordance with embodiments of the present disclosure. As shown in FIG. 4, first control loop 26 may comprise a loop filter 32 and a power converter 40.

Loop filter 32 may comprise any system, device, or apparatus configured to receive an input signal (e.g., first signal $V_{IN\_1}$ or a derivative thereof) and a feedback signal (e.g., voltage $V_{PC}$, a derivative thereof, or other signal indicative of signal $V_{PC}$) and based on such input signal and feedback signal, generate a controller input signal to be communicated to converter controller 34. In some embodiments, such controller input signal may comprise a signal indicative of an integrated error between the input signal and the feedback signal. In other embodiments, such controller input signal may comprise a signal indicative of a target voltage signal to be driven as voltage $V_{PC}$ or a target current signal to be driven by power converter 40.

Converter controller 34 may comprise any system, device, or apparatus configured to, based on an input signal (e.g., output signal of loop filter 32), voltage $V_{PC}$, and/or other characteristics of first control loop 26, control switching of switches integral to power converter 40, in order to cause first control loop 26 to generate voltage $V_{PC}$ as a function of first signal $V_{IN\_1}$.

As shown in FIG. 4, power converter 40 may include a power inductor 42, and switches 44, 46, 47, and 49 arranged as shown. In some embodiments, a voltage $V_{SUPPLY}$ (e.g., provided by power supply 10 depicted in FIG. 2) may be received via input terminals including a positive input terminal and a negative input terminal which may be coupled to a ground voltage. Accordingly, in operation, converter controller 34 may be configured to control switches 44, 46, 47, and 49 in order to convert voltage $V_{SUPPLY}$ to voltage $V_{PC}$, such that voltage $V_{PC}$ is a function of first signal $V_{IN\_1}$ to loop filter 32.

Turning again to FIG. 3, second control loop 28 may receive at its inputs voltage $V_{PC}$ generated by first control loop 26, second signal $V_{IN\_2}$, and audio input signal $V_{IN}$, and based thereon may generate at its output audio output signal $V_{OUT}$. As described in greater detail in this disclosure (including, without limitation, in reference to FIG. 5, below), second control loop 28 may comprise at least one linear amplifier and, in some embodiments, a plurality of switches, wherein the at least one linear amplifier and the plurality of switches, if present, are controlled by a loop filter in order generate audio output signal $V_{OUT}$ based on voltage $V_{PC}$, second signal $V_{IN\_2}$, and audio input signal $V_{IN}$, such that audio output signal $V_{OUT}$ is a function of audio input signal $V_{IN}$.

Figure 5:
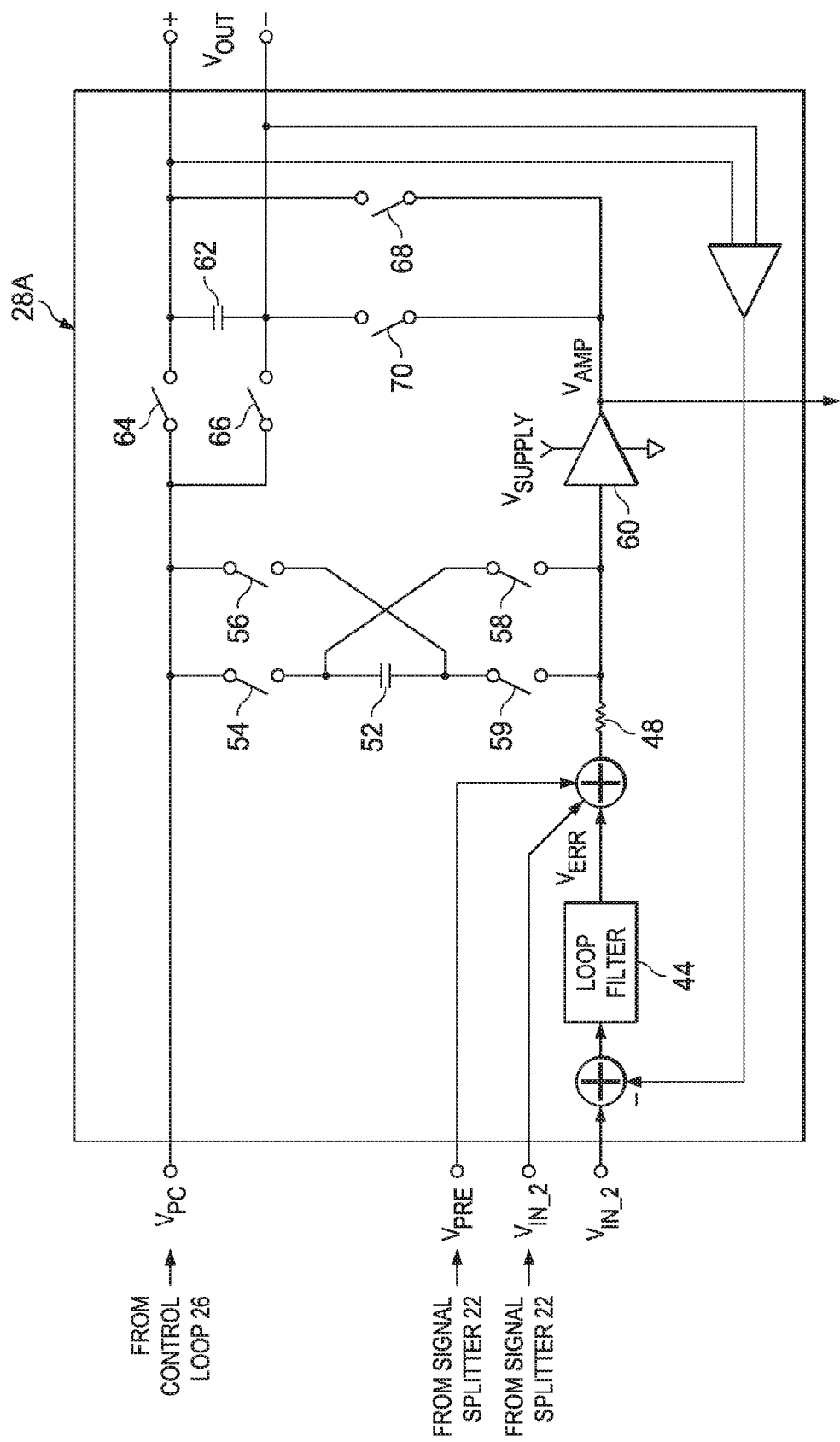
FIG. 5 illustrates a circuit diagram of selected components of an example control loop that may be used to implement the second control loop depicted in FIG. 3, in accordance with embodiments of the present disclosure.

FIG. 5 illustrates a circuit diagram of selected components of an example control loop 28A that may be used to implement second control loop 28 depicted in FIG. 3, in accordance with embodiments of the present disclosure. As shown in FIG. 5, second control loop 28 may comprise a loop filter 44, a linear amplifier 60, an output capacitor 62, a first full-switching bridge comprising switches 64, 66, 68, and 70, a switched capacitor 52, and a second full-switching bridge comprising switches 54, 56, 58, and 59.

Loop filter 44 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a filtered error signal $V_{ERR}$ to be combined with second signal $V_{IN\_2}$ and communicated to linear amplifier 60. In some embodiments, such filtered error signal $V_{ERR}$ may comprise a signal indicative of an integrated error between the input signal and the feedback signal. In other embodiments, such filtered error signal $V_{ERR}$ may comprise a signal that when combined with second signal $V_{IN\_2}$ is indicative of a target voltage signal to be driven as linear output voltage $V_{AMP}$. In these and other embodiments, loop filter 44 may include control circuitry and may drive control circuitry for controlling switches 54, 56, 58, 59, 64, 66, 68, and 70, in order to cause second control loop 28 to generate audio output signal $V_{OUT}$ as a function of voltage $V_{PC}$ and second signal $V_{IN\_2}$ (and thus a function of audio input signal $V_{IN}$).

As shown in FIG. 5, first control loop 26 may drive voltage $V_{PC}$ which is received by second control loop 28. Accordingly, first control loop 26 may be considered a first processing path configured to process a first signal (e.g., first signal $V_{IN\_1}$) derived from an input signal (e.g., audio input signal $V_{IN}$) to generate a first path voltage ($V_{PC}$) at a first processing path output (e.g., output of first control loop 26).

Switch 64 may be coupled between the output of first control loop 26 and a first load terminal of second control loop 28, and switch 66 may be coupled between the output of first control loop 26 and a second load terminal of second control loop 28. Linear amplifier 60 may be configured to drive a linear amplifier output voltage $V_{AMP}$ which is a function of the filtered error signal $V_{ERR}$ generated by loop filter 44. Switch 68 may be coupled between the output of linear amplifier 60 and the first load terminal of second control loop 28, and switch 70 may be coupled between the output of linear amplifier 60 and the second load terminal of second control loop 28. Output capacitor 62 may be coupled between a first load terminal (e.g., positive terminal of audio output signal $V_{OUT}$) and a second load terminal (e.g., negative terminal of audio output signal $V_{OUT}$). Accordingly, linear amplifier 60 may be considered a second processing path configured to process a second signal (e.g. second signal $V_{IN\_2}$) derived from an input signal (e.g., audio input signal $V_{IN}$) to generate a second path voltage ($V_{AMP}$) at a second processing path output (e.g., output of linear amplifier 60). In addition, the first full-switching bridge may accordingly include a first plurality of switches (e.g., 64 and 66) comprising at least a first switch (e.g., 64) coupled between the first processing path output and a first load terminal, and a second switch (e.g., 66) coupled between the first processing path output and a second load terminal and a second plurality of switches (e.g., 68 and 70) comprising at least a third switch (e.g., 68) coupled between the second processing path output and the first load terminal and a fourth switch (e.g., 70) coupled between the second processing path output and the second load terminal.

In operation of second control loop 28, loop filter 44 or another controller may activate switches 64 and 70 and deactivate switches 66 and 68 for positive values of audio output signal $V_{OUT}$ and activate switches 66 and 68 and deactivate switches 64 and 70 for negative values of audio output signal $V_{OUT}$. Loop filter 44 or such other controller may, as power converter output voltage $V_{PC}$ approaches its lower saturation limit, cause linear amplifier 60 to drive a non-zero linear amplifier output voltage $V_{AMP}$ in order to increase a common mode voltage between the first output terminal and the second output terminal, allowing audio output signal $V_{OUT}$ to approach and cross zero. Above the lower saturation limit of power converter output voltage $V_{PC}$, converter controller 34 may cause linear amplifier 60 to drive an approximately zero linear amplifier output voltage $V_{AMP}$ such that a magnitude of audio output signal $V_{OUT}$ is equal to power converter output voltage $V_{PC}$.

Figure 6:
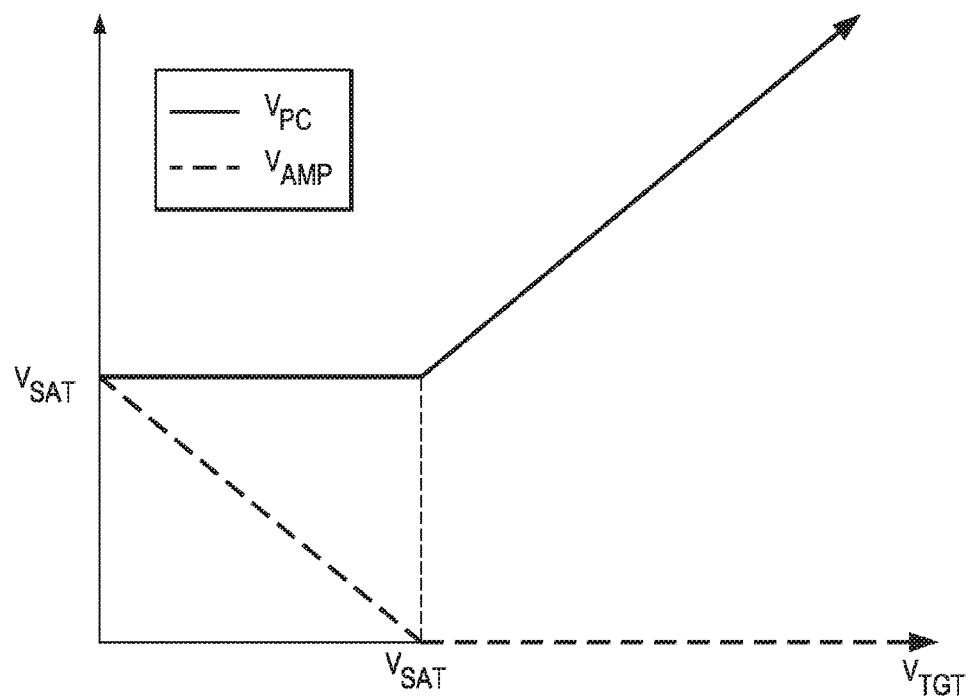
FIG. 6 illustrates a graph depicting the relationship of a voltage driven by the first control loop depicted in FIG. 3 and a voltage driven by a linear amplifier of the output stage depicted in FIG. 3 as a function of a desired output voltage, in accordance with embodiments of the present disclosure.

In other words, first control loop 26 and linear amplifier 60 may be controlled to generate voltages in accordance with the following functions, which are graphically depicted in FIG. 6, and wherein voltage $V_{TGT}$ represents a target or desired voltage to be output as audio output signal $V_{OUT}$:

$$V_{PC}=V_{TGT}; \text{ for } |V_{TGT}|>V_{SAT}$$

$$V_{PC}=V_{SAT}; \text{ for } |V_{TGT}|\le V_{SAT}$$

$$V_{AMP}=0; \text{ for } |V_{TGT}|>V_{SAT}$$

$$V_{AMP}=V_{SAT}-V_{TGT}; \text{ for } |V_{TGT}|\le V_{SAT}$$

In some embodiments, an offset voltage may be added to each of the output of first control loop 26 and the output of linear amplifier 60, to ensure that the voltage $V_{AMP}>0$ at all times.

Accordingly, presence of linear amplifier 60 and its ability to increase the common mode voltage of the output terminals in response to low magnitudes of the output signal $V_{OUT}$ may minimize non-linearities of audio output signal $V_{OUT}$ as a function of audio input signal $V_{IN}$, and permit crossing a magnitude of zero by audio output signal $V_{OUT}$.

With respect to the second full-switching bridge, switch 54 may be coupled between the output of first control loop 26 and a first terminal of switching capacitor 52, and switch 56 may be coupled between the output of first control loop 26 and a second load of switching capacitor 52. Switch 58 may be coupled between the input of linear amplifier 60 and the first terminal of switching capacitor 52, and switch 59 may be coupled between the input of linear amplifier 60 and the second terminal of switching capacitor 52. Accordingly, the second full-switching bridge may include a third plurality of switches (e.g., 54 and 56) comprising at least a fifth switch (e.g., 54) coupled between the first processing path output (e.g., output of first control loop 26) and a first capacitor terminal and a sixth switch (e.g., 56) coupled between the first processing path output and the second capacitor terminal and a fourth plurality of switches (e.g., 58 and 59) comprising at least a seventh switch (e.g., 58) coupled between a second processing path input (e.g., input of linear amplifier 60) and the first capacitor terminal and an eighth switch (e.g., 59) coupled between the second processing path input and the second capacitor terminal.

In operation of second control loop 28, loop filter 44 or another controller may control switches 54, 56, 58, and 59 of the second switching full-bridge such that when switches 64, 66, 68, and 70 of the first switching full-bridge are switched to reverse connectivity of the output of first control loop 26 and the output of linear amplifier 60 to the first load terminal and the second load terminal as described above, switches 54, 56, 58, and 59 of the second switching full-bridge may be switched substantially contemporaneously with switching of switches 64, 66, 68, and 70 of the first switching full-bridge to reverse connectivity of the output of first control loop 26 and the input of linear amplifier 60 to the terminals of switching capacitor 52 in order to minimize voltage discontinuities caused by the switching of switches 64, 66, 68, and 70 of the first switching full-bridge.

Figure 7:
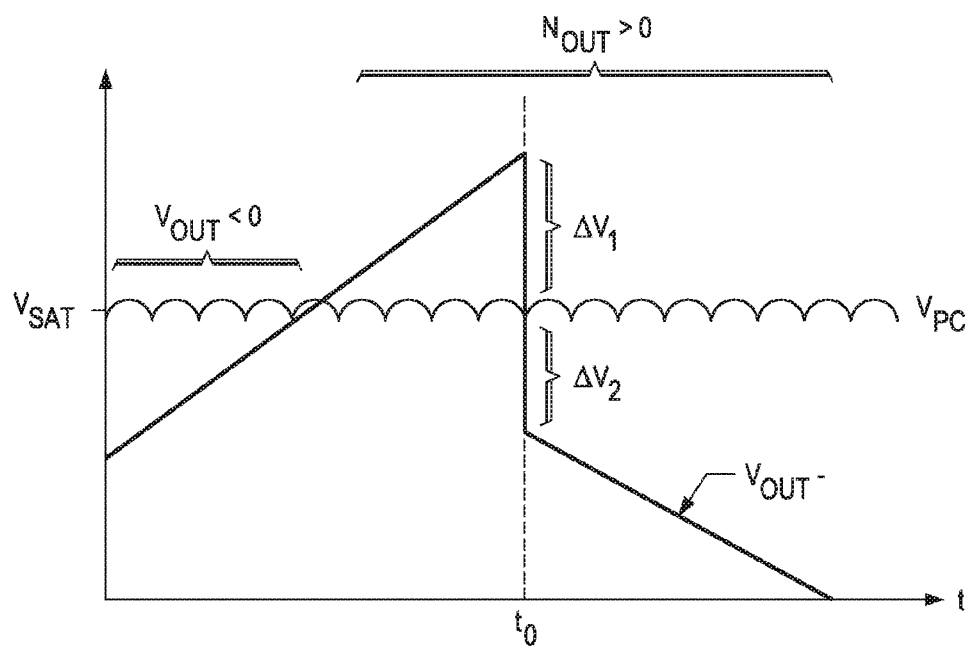
FIG. 7 illustrates a graph depicting the relationship of a voltage driven by the first control loop depicted in FIG. 3 and a voltage driven by a linear amplifier of the output stage depicted in FIG. 3 as a function of time, in accordance with embodiments of the present disclosure.

To further illustrate the effect of such switching, FIG. 7 illustrates a graph depicting the relationship of voltage $V_{PC}$ driven by first control loop 26 and voltage driven by a linear amplifier 60 as a function of time, in accordance with embodiments of the present disclosure. FIG. 7 depicts such signal voltages during a time when a magnitude of audio output signal $V_{OUT}$ is less than the lower saturation value of voltage $V_{PC}$. Accordingly, during such time, first control loop 26 may output voltage $V_{PC}$ having a direct-current value of lower saturation voltage $V_{SAT}$ with a high-frequency ripple component superimposed as shown in FIG. 7. As audio output signal $V_{OUT}$ increases from a negative polarity to cross zero and increase to positive values, the voltage $V_{OUT}^-$ at the negative terminal of the output of second control loop 28 generated by linear amplifier 60 (e.g., voltage $V_{AMP}$ which is passed through switches 68 and 70 depending on states of such switches) may have a waveform as depicted in FIG. 7. As seen in FIG. 7, so that voltage $V_{AMP}$ may maintain a positive value above zero, commutation of the first full-switching bridge of switches 64, 66, 68, and 70 may occur when audio output signal $V_{OUT}$ is non-zero, as shown at time $t_0$ in FIG. 7. When such output polarity transition occurs at non-zero audio output signal $V_{OUT}$, linear amplifier 60 must immediately transition from supplying a voltage that is $\Delta V_1$ greater than output voltage $V_{PC}$ to a voltage that is $\Delta V_2$ lesser than output voltage $V_{PC}$. In order to minimize discontinuity in audio output signal $V_{OUT}$, $\Delta V_1$ must be maintained approximately equal to $\Delta V_2$.

Referring again to FIG. 5, a low-pass filter comprising parasitic resistance 48 and capacitor 52 may create a significant delay path in second control loop 28, such that if the transition of the first full-switching bridge of switches 64, 66, 68, and 70 is driven solely by second control loop 28, the delays imposed by the low-pass filter may now allow for fast resolution of the discontinuity. However, by commutating the second full-switching bridge of switches 54, 56, 58, and 59 substantially contemporaneously with the first full-switching bridge of switches 64, 66, 68, and 70, such delay may be alleviated.

In addition, while switching capacitor 52 and parasitic resistance 48 may effectively form a low-pass filter as seen from the output of loop filter 44, switching capacitor 52 and parasitic resistance 48 may effectively form a high-pass filter as seen from the output of control loop 26. Accordingly, high-frequency components of voltage $V_{PC}$, such as the high-frequency ripple depicted in FIG. 7, may be capacitively coupled into the input of linear amplifier 60, such that the high-frequency components are coupled (e.g., in a feedforward manner) into the input of linear amplifier 60 and passed to linear amplifier output voltage $V_{AMP}$, such that the high-frequency components of voltage $V_{PC}$ are effectively cancelled out by voltage $V_{AMP}$, and such that the high-frequency components of voltage $V_{PC}$ are substantially absent from the load voltage. Accordingly, the feedback control loop of second control loop 28 may operate predominantly on low-frequency components of voltage $V_{PC}$ and voltage $V_{AMP}$ below a corner frequency of the high-pass filter.

In an ideal case, the polarity of audio output signal $V_{OUT}$ could be flipped at an exact zero-crossing point. However, monitoring and determining an exact zero-crossing is difficult, and to avoid oscillation, delay and hysteresis may need to be inserted, making monitoring and determining an exact zero-crossing even more difficult. In order to cause no effect on an output load coupled to the output of second control loop 28, at least one of voltage $V_{PC}$ and voltage $V_{AMP}$ must have a sudden voltage step in order to maintain a proper voltage balance for audio output signal $V_{OUT}$. Without accounting for such sudden step, discontinuities caused by commutating polarity of capacitor 52 near a zero-crossing of audio output signal $V_{OUT}$ may be undesirably compensated by loop filter 44, which may lead to decreased total harmonic distortion. Accordingly, when a condition for commutating connectivity of the switching full-bridge comprising switches 54, 56, 58, and 59 occurs (e.g., a zero-crossing of audio output signal $V_{OUT}$), switches of the switching full-bridge comprising switches 54, 56, 58, and 59 may be controlled to commutate polarity of capacitor 52 with respect to voltage $V_{PC}$ and the input to linear amplifier 60. However, in addition, further in response to such condition for commutating connectivity of the switching full-bridge comprising switches 54, 56, 58, and 59, precompensation voltage signal $V_{PRE}$ may be added between the output of loop filter 44 and the low-pass filter created by parasitic resistance 48 and capacitor 52. Insertion of precompensation voltage signal $V_{PRE}$ is thus insertion of a feedforward compensation that bypasses loop filter 44 in order to prevent discontinuities caused by commutation of the polarity of capacitor 52 from being compensated by loop filter 44. Thus, in response to a condition for commutating connectivity of the switching full-bridge comprising switches 54, 56, 58, and 59, signal splitter 22 may set precompensation voltage signal $V_{PRE}$ for a period of time (e.g., such period of time related to the bandwidth of loop filter 44) such that the equation $V_{AMP}(t)=(V_{ERR}(t)+V_{PRE\_BW}(t))A(t)B(t)$, where $V_{PRE\_BW}$ is precompensation voltage signal $V_{PRE}$ at a bandwidth of interest (e.g., audio band of 20 kilohertz), A(t) is a transfer function of the low-pass filter created by parasitic resistance 48 and capacitor 52, and B(t) is a transfer function of linear amplifier 60. In the absence of the condition for commutating connectivity of the switching full-bridge, or after a period of time after the occurrence of condition for commutating connectivity of the switching full-bridge, signal splitter 22 may set the value of voltage signal $V_{PRE}$ to zero, as such compensation may not be needed during such periods.

Figure 8:
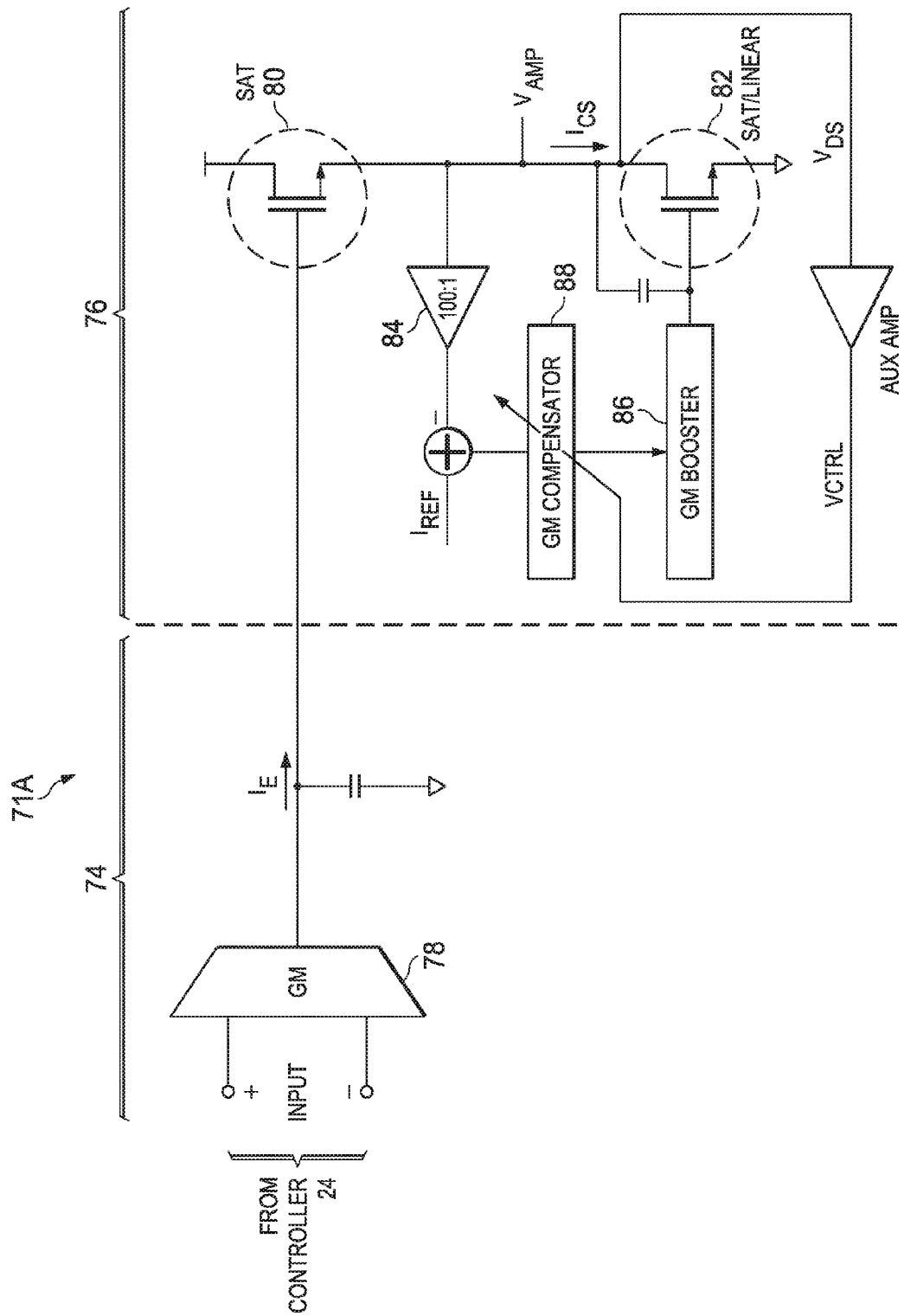
FIG. 8 illustrates a circuit diagram of selected components of an example linear amplifier that may be used to implement the linear amplifier depicted in FIG. 5, in accordance with embodiments of the present disclosure.

FIG. 8 illustrates a circuit diagram of selected components of an example linear amplifier 71A that may be used to implement linear amplifier 60 depicted in FIG. 5, in accordance with embodiments of the present disclosure. As shown in FIG. 8, linear amplifier 71A may include a first stage 74 and a second stage 76. First stage 74 may comprise a gain stage 78 having a transconductance gain Gm to convert a voltage signal INPUT received from controller 24 to a current $I_E$.

Second stage 76 may comprise a totem-pole topology with an input at a gate terminal of n-type field effect transistor (NFET) 80 and an output node shared by the drain terminal of NFET 82 of source terminal of NFET 80 at which linear amplifier 71A drives linear amplifier output voltage $V_{AMP}$. In such topology, NFET 80 may source current into a load coupled to the output node and NFET 82 may sink current from such load. A local current feedback loop may be arranged with respect to NFET 82 in order to regulate a minimum level of quiescent current through NFET 80. Thus, second stage 76 may be viewed as a source follower having a unity gain from its input node (e.g. gate terminal of NFET 80) to its output node.

Within the current feedback loop of second stage 76, a current-sensing amplifier 84 may sense a current associated with NFET 80 generating a scaled current to be compared with a reference current $I_{REF}$, resulting in an error current equal to the difference between the scaled current and reference current $I_{REF}$. A gain booster stage 86 may receive the error current and operate as a current mirror to compensate for loss of loop gain due to the current sensing scheme of current-sensing amplifier 84. At the output of gain booster stage 86, a conventional Miller-compensated common-source output scheme may be applied for stability as long as NFET 82 remains in its saturation region, which may be maintained by keeping its drain-to-source voltage $V_{DS}$ being greater than a saturation voltage $V_{d\_sat}$. For example, when drain-to-source voltage $V_{ds}$ becomes less than $V_{d\_sat}$ for a given drain-to-source voltage $I_{ds}$ of NFET 82, an output drain impedance of NFET 82 may decrease, and a voltage gain of NFET 82 will decrease accordingly. Consequently, the current loop gain and unity-gain bandwidth of the local current feedback loop may decrease. When such an amplifier is integral to a high-order feedback loop, reduction of unity-gain bandwidth may lead to system instability and must be avoided. Therefore, gain-compensator 88 may be present and may include a variable current gain as a function of drain-to-source voltage of NFET 82, which in the first order can be translated to an output impedance of NFET 82.

Figure 9:
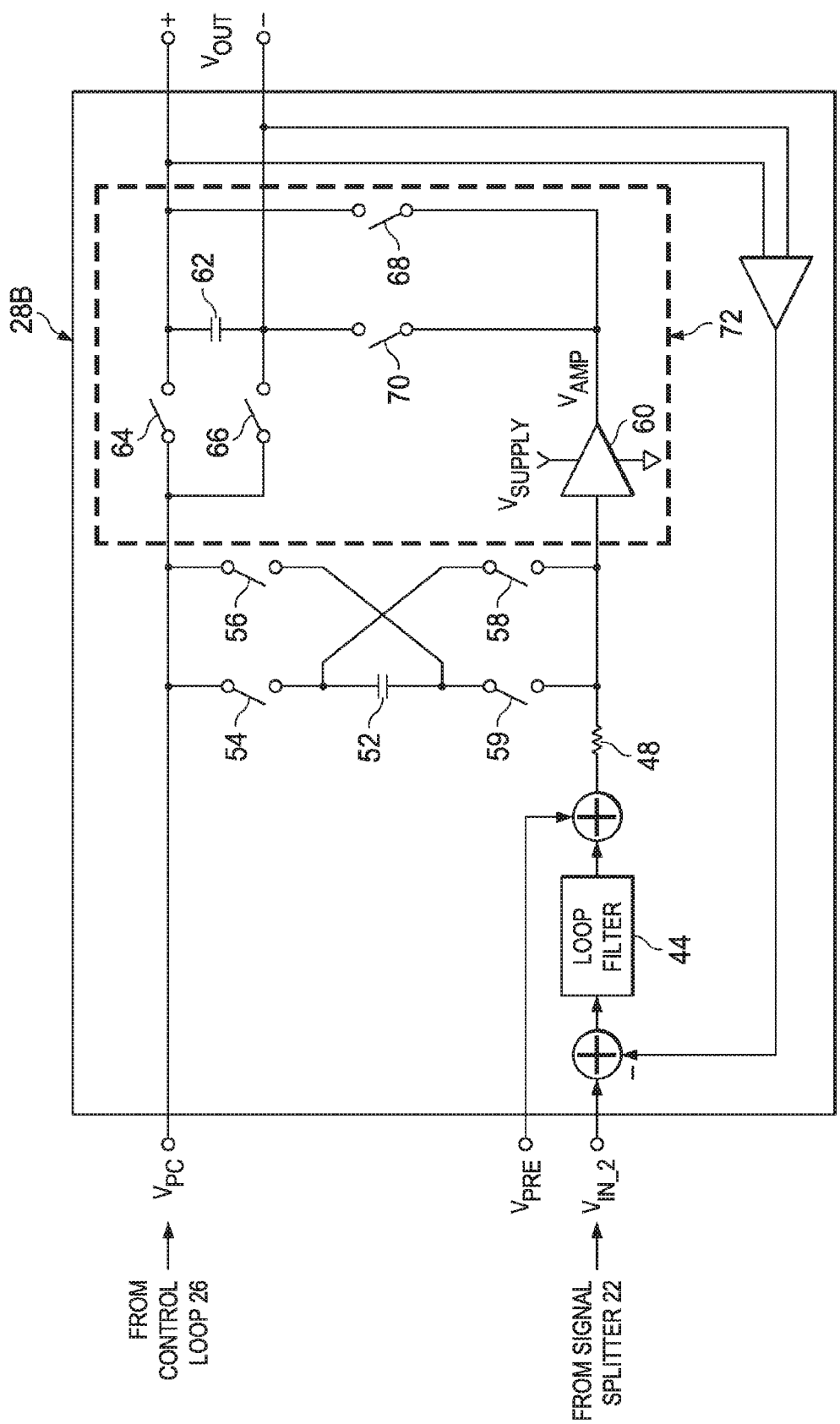
FIG. 9 illustrates a circuit diagram of selected components of another example output stage that may be used to implement the second control loop depicted in FIG. 3, in accordance with embodiments of the present disclosure.

FIG. 9 illustrates a circuit diagram of selected components of another example output stage 28B that may be used to implement control loop 28 depicted in FIG. 3, in accordance with embodiments of the present disclosure. Output stage 28B of FIG. 9 may be similar in many respects to output stage 28A of FIG. 5, and thus, only the main differences between output stage 28B and output stage 28A are discussed in detail. One main difference between output stage 28B and output stage 28A is that in output stage 28B, linear amplifier 60, switch 64, switch 66, switch 68, and/or switch 70 may be integral to a final output stage of a differential amplifier 72.

Figure 10:
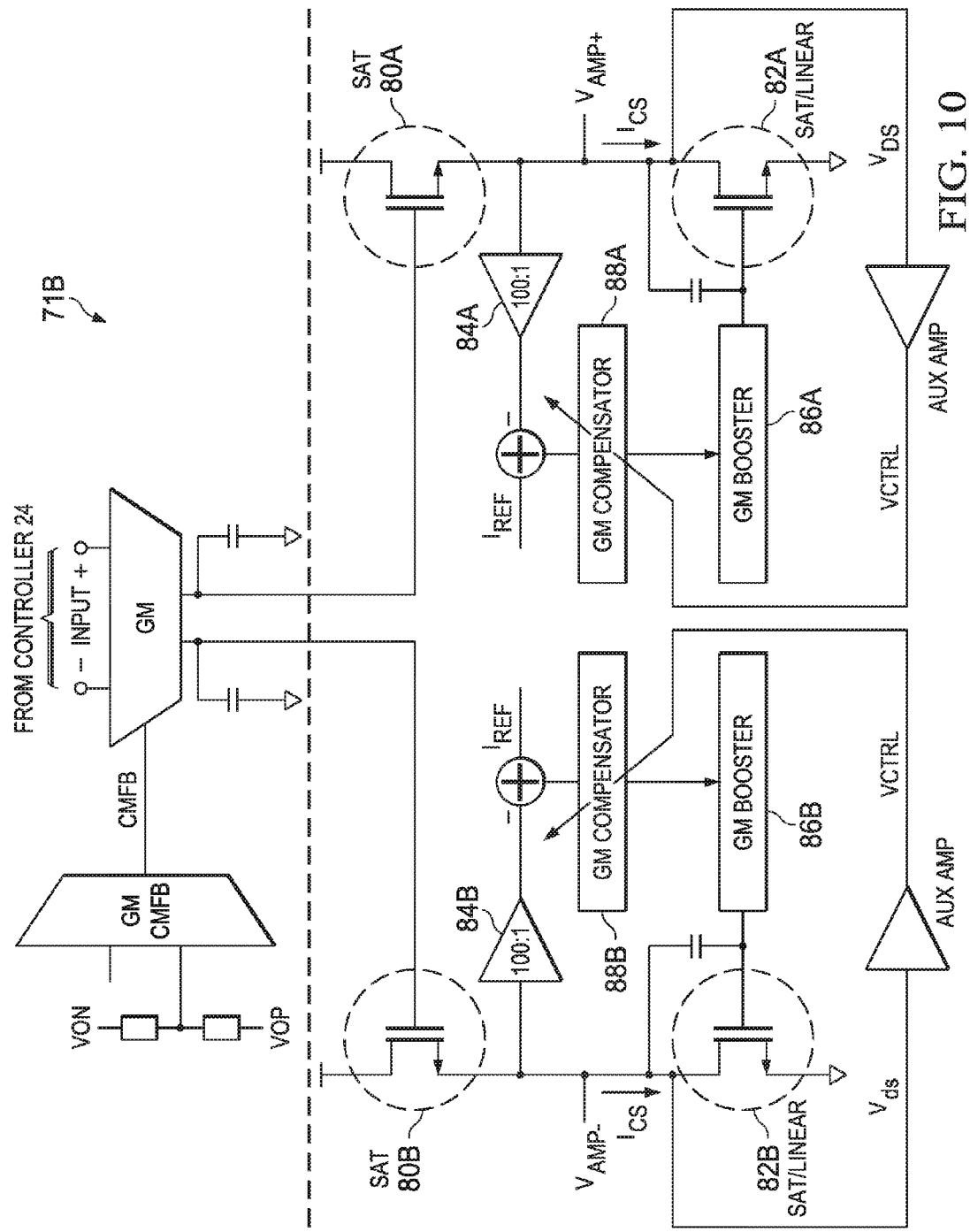
FIG. 10 illustrates a circuit diagram of selected components of an example linear amplifier that may be used to implement the linear amplifier depicted in FIG. 8, in accordance with embodiments of the present disclosure.

To further illustrate, FIG. 10 illustrates a circuit diagram of an example linear amplifier 71B which may be used to implement portions of the example output stage 28B depicted in FIG. 9, in accordance with embodiments of the present disclosure. As one of skill in the relevant art may recognize, linear amplifier 71B may comprise the differential-output analog to the single-ended topology of linear amplifier 71A depicted in FIG. 8, and analogous components of linear amplifier 71B have the same reference numerals as that of linear amplifier 71A with an additional letter "A" or "B" added to the reference numerals. In some embodiments, one or more of NFETs 80A, 80B, 82A, and 82B may be equivalent to switches 64, 66, 68, and 70, respectively, of output stage 28B of FIG. 9.

In these and other embodiments, additional circuitry may be present to cause the gate-to-source voltage of switch 66 and/or 64 to be at or greater than supply voltage(s) in order to operate as a switch (e.g., activate and deactivate). In these and other embodiments, switch 70 and/or 68 may operate in the linear region of such devices, wherein the gate-to-source voltage of such devices is less than the supply voltage.

In light of the foregoing, in operation, switches 68 and 70 of example output stage 28B may be viewed as ground-referenced devices in a first differential amplifier and switches 64 and 66 may be viewed as supply voltage-referenced devices of a second differential amplifier example output stage 28B. When viewed in such manner, the behavior of the amplifier described herein operates to control polarity and magnitude of output voltage $V_{OUT}$ by operating such first and second differential amplifiers such that, when implemented as transistors (e.g., n-type metal-oxide-semiconductor field-effect transistors), one switch in each of the differential amplifiers may operate in its saturation region while the remaining switch in each of the differential amplifiers may operate in its linear region. For example, when switch 64 operates in its saturated region, switch 66 may operate in its linear region, and vice versa. When switch 68 operates in its saturated region, switch 70 may operate in its linear region, and vice versa. Because of this behavior, non-idealities (such as high-frequency switching ripple) may be divided between such differential amplifiers such that the predominance of ripple is seen by one switch in each such differential amplifier.

As used herein, a "switch" may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches described herein are not depicted although such control signals would be present to selectively enable and disable such switches. In some embodiments, a switch may comprise a metal-oxide-semiconductor field-effect transistor (e.g., an n-type metal-oxide-semiconductor field-effect transistor).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A signal processing system for producing a load voltage at a load output of the signal processing system, the load output comprising a first load terminal having a first load voltage and a second load terminal having a second load voltage such that the load voltage comprises a difference between the first load voltage and the second load voltage, the signal processing system comprising:
    a first processing path configured to process a first signal derived from an input signal to generate a first path voltage at a first processing path output;
    a second processing path configured to process a second signal derived from the input signal to generate a second path voltage at a second processing path output, the second processing path comprising a linear amplifier having at least one transistor for driving the second path voltage;
    a signal splitter configured to receive the input signal and generate the first signal and the second signal from the input signal, such that the second signal comprises information of the input signal absent from the first signal, and such that the second path voltage is of a sufficient magnitude such that the at least one transistor operates in a saturation region of the at least one transistor throughout a dynamic range of the load voltage, wherein the signal splitter generates the first signal to include a direct-current offset voltage greater than or equal to a minimum magnitude of the second path voltage sufficient to ensure that the at least one transistor operates in the saturation region throughout the dynamic range; and
    a controller configured to control the first processing path, the second processing path, and the signal splitter in order to generate the load voltage as a function of the input signal.

2. The signal processing system of claim 1, further comprising a monitoring circuit configured to determine the minimum magnitude and communicate a signal indicative of the minimum magnitude to the signal splitter.

3. The signal processing system of claim 1, further comprising a learning circuit configured to learn the minimum magnitude and communicate a signal indicative of the minimum magnitude to the signal splitter.

4. The signal processing system of claim 1, wherein the first processing path comprises a power converter having a power inductor and a plurality of switches, and the controller is further configured to control the plurality of switches in accordance with the input signal to provide electrical power to the load output.

5. The signal processing system of claim 4, wherein the controller is further configured to control the linear amplifier to minimize power consumption at the load output and minimize non-linearity of the load voltage caused by the power converter.

6. A method for producing a load voltage at a load output of the signal processing system, the load output comprising a first load terminal having a first load voltage and a second load terminal having a second load voltage such that the load voltage comprises a difference between the first load voltage and the second load voltage, the method comprising:
    processing a first signal derived from an input signal with a first processing path to generate a first path voltage at a first processing path output;
    processing a second signal derived from the input signal with a second processing path to generate a second path voltage at a second processing path output, the second processing path comprising a linear amplifier having at least one transistor for driving the second path voltage;
    generating the first signal and the second signal with a signal splitter, such that the second signal comprises information of the input signal absent from the first signal, and such that the second path voltage is of a sufficient magnitude such that the at least one transistor operates in a saturation region of the at least one transistor throughout a dynamic range of the load voltage;
    generating the first signal to include a direct-current offset voltage greater than or equal to a minimum magnitude of the second path voltage sufficient to ensure that the at least one transistor operates in the saturation region throughout the dynamic range; and
    controlling the first processing path, the second processing path, and the signal splitter in order to generate the load voltage as a function of the input signal.

7. The method of claim 6, further comprising:
    determining the minimum magnitude; and
    communicating a signal indicative of the minimum magnitude to the signal splitter.

8. The method of claim 6, further comprising learning the minimum magnitude and communicating a signal indicative of the minimum magnitude to the signal splitter.

9. The method of claim 6, wherein the first processing path comprises a power converter having a power inductor and a plurality of switches, and the method further comprises controlling the plurality of switches in accordance with the input signal to provide electrical power to the load output.

10. The method of claim 9, further comprising controlling the linear amplifier to minimize power consumption at the load output and minimize non-linearity of the load voltage caused by the power converter.

11. A signal processing system for producing a load voltage at a load output of the signal processing system, the load output comprising a first load terminal having a first load voltage and a second load terminal having a second load voltage such that the load voltage comprises a difference between the first load voltage and the second load voltage, the signal processing system comprising:
- a first processing path configured to process a first signal derived from an input signal to generate a first path voltage at a first processing path output, wherein the first processing path comprises a power converter having a power inductor and a plurality of switches;
- a second processing path configured to process a second signal derived from the input signal to generate a second path voltage at a second processing path output, the second processing path comprising a linear amplifier having at least one transistor for driving the second path voltage;
- a signal splitter configured to receive the input signal and generate the first signal and the second signal from the input signal, such that the second signal comprises information of the input signal absent from the first signal, and such that the second path voltage is of a sufficient magnitude such that the at least one transistor operates in a saturation region of the at least one transistor throughout a dynamic range of the load voltage; and
- a controller configured to:
  - control the first processing path, the second processing path, and the signal splitter in order to generate the load voltage as a function of the input signal; and
  - control the plurality of switches in accordance with the input signal to provide electrical power to the load output.

12. The signal processing system of claim 11, further comprising a monitoring circuit configured to determine the minimum magnitude and communicate a signal indicative of the minimum magnitude to the signal splitter.

13. The signal processing system of claim 11, further comprising a learning circuit configured to learn the minimum magnitude and communicate a signal indicative of the minimum magnitude to the signal splitter.

14. The signal processing system of claim 11, wherein the controller is further configured to control the linear amplifier to minimize power consumption at the load output and minimize non-linearity of the load voltage caused by the power converter.

15. A method for producing a load voltage at a load output of the signal processing system, the load output comprising a first load terminal having a first load voltage and a second load terminal having a second load voltage such that the load voltage comprises a difference between the first load voltage and the second load voltage, the method comprising:
- processing a first signal derived from an input signal with a first processing path to generate a first path voltage at a first processing path output, wherein the first processing path comprises a power converter having a power inductor and a plurality of switches;
- processing a second signal derived from the input signal with a second processing path to generate a second path voltage at a second processing path output, the second processing path comprising a linear amplifier having at least one transistor for driving the second path voltage;
- generating the first signal and the second signal with a signal splitter, such that the second signal comprises information of the input signal absent from the first signal, and such that the second path voltage is of a sufficient magnitude such that the at least one transistor operates in a saturation region of the at least one transistor throughout a dynamic range of the load voltage;
- controlling the first processing path, the second processing path, and the signal splitter in order to generate the load voltage as a function of the input signal; and
- controlling the plurality of switches in accordance with the input signal to provide electrical power to the load output.

16. The method of claim 15, further comprising:
determining the minimum magnitude; and
communicating a signal indicative of the minimum magnitude to the signal splitter.

17. The method of claim 15, further comprising learning the minimum magnitude and communicating a signal indicative of the minimum magnitude to the signal splitter.

18. The method of claim 15, further comprising controlling the linear amplifier to minimize power consumption at the load output and minimize non-linearity of the load voltage caused by the power converter.

* * * * *